United States Patent [19]

Anderson et al.

[11] Patent Number: 4,953,928
[45] Date of Patent: Sep. 4, 1990

[54] MOS DEVICE FOR LONG-TERM LEARNING

[75] Inventors: Janeen D. W. Anderson, Fremont; Carver A. Mead, Pasadena, both of Calif.

[73] Assignee: Synaptics Inc., San Jose, Calif.

[21] Appl. No.: 363,678

[22] Filed: Jun. 9, 1989

[51] Int. Cl.$^5$ .................... H01L 29/78; H01L 27/02; G11C 11/34

[52] U.S. Cl. ................................ 357/23.5; 357/43; 357/42; 365/185

[58] Field of Search .................. 357/23.5, 43; 365/185

[56] References Cited

U.S. PATENT DOCUMENTS

| | | | |
|---|---|---|---|
| 4,375,087 | 2/1983 | Wanlass | 357/23.5 |
| 4,432,075 | 2/1984 | Eitan | 365/185 |
| 4,672,409 | 6/1987 | Takei et al. | 365/185 |

FOREIGN PATENT DOCUMENTS

| | | | |
|---|---|---|---|
| 59-75671 | 4/1984 | Japan | 357/23.5 |

OTHER PUBLICATIONS

J. P. Verwey, "Nonavalanche Injection of Hot Carriers into SiO$_2$", J. Appl. Phys., vol. 44, No. 6, 6/73, pp. 2681–2687.

C. A. Boesselaar, "Charge Injection Into SiO$_2$ from Reverse Biased Junction", Solid State Electronics, 1973, vol. 16, pp. 648–651.

Primary Examiner—Rolf Hille
Assistant Examiner—Robert P. Limanek
Attorney, Agent, or Firm—Lyon & Lyon

[57] ABSTRACT

A semiconductor structure for long-term learning includes a p-type silicon substrate or well having first and second spaced apart n-type regions formed therein. A polysilicon floating gate is separated from the surface of the silicon substrate by a layer of gate oxide. One edge of the polysilicon floating gate is aligned with the edge of the first n-type region such that the polysilicon floating gate does not appreciably overly the n-type region. The second n-type region lies beyond the edge of the polysilicon floating gate. The first n-type region, the silicon substrate, and the second n-type region form the collector, base, and emitter, respectively, of a lateral bipolar transistor.

An alternate embodiment of a semiconductor long-term learning structure includes an n-type silicon substrate having a p-well region formed therein. An n-type region is formed within the well region. A polysilicon floating gate is separated from the surface of the silicon substrate by a gate oxide and is positioned above the well region. One edge of the polysilicon floating gate is aligned with the edge of the n-type region within the well region such that the polysilicon floating gate does not appreciably overly the n-type region. The substrate, the well, and the n-type region, respectively, form the emitter, base, and collector of a bipolar transistor.

12 Claims, 5 Drawing Sheets

MOS DEVICE FOR LONG-TERM LEARNING

BACKGROUND OF THE INVENTION

1. Field Of The Invention

The present invention relates to analog silicon structures for performing the long term learning function in neural networks. More particularly, the present invention relates to floating gate MOS structures for performing the long term learning function.

2. The Prior Art

The most common form of prior art long-term non-volatile storage devices use charge stored on a floating silicon gate, embedded in pure silicon dioxide. The charge on such a gate will stay fixed for periods of many years. Devices using charge stored on floating gates require that charge be injected when it is desired to "write" the signal, but not leak off when the value of the stored signal is "read".

The first method of injecting charge through the oxide onto the floating gate was to avalanche a junction formed at one edge of the floating gate. The avalanche process creates an electron population with a broad energy distribution. Some of these electrons have enough energy to surmount the approximately 3.2 eV barrier from the conduction band of the silicon substrate to the oxide conduction band, so they can penetrate the oxide and end up on the floating gate. The avalanche process requires very high voltages and simultaneously high current, and is therefore very inconvenient to use as a learning mechanism.

A second charge-injection mechanism that has been employed in floating-gate structures is electron tunneling. When a sufficiently high electric field is placed across the oxide, electrons will tunnel from the substrate to the floating gate, or from one gate level to another. The rate at which this process takes place is a function only of the electric field, and requires high voltages (but not high currents).

Tunneling from the active layers to a floating polysilicon gate requires special processing to produce very thin oxides of very controlled thickness. To avoid this difficulty, tunneling from one polysilicon layer to another can be used. The oxidation of polycrystalline silicon produces sharp points (asperities) of remaining silicon that act as field-emission tips and greatly reduce the voltage required for tunneling. Using this technique, tunneling is a useful injection mechanism for a learning network using the oxide thicknesses available in a standard double-poly process. In a typical application, the first layer of polysilicon (poly-1) is used as the floating gate, and a small overlying patch of second layer polysilicon (poly-2) functions as the charge-injecting electrode.

The enhanced-tunneling mechanism is, by its very nature, asymmetrical. The inter-poly oxide is grown by oxidizing poly-1, and poly-2 is then deposited over the rather smooth oxide surface. There are no asperites on the bottom of poly-2 to enhance the electric field. For this reason, electrons can be removed from the floating poly-1 electrode by making the poly-2 plate positive, but a much higher voltage is required to inject electrons onto the poly-1. For a long term learning system, it is necessary to change the charge on the floating gate in either direction, i.e., to selectively remove electrons from, or add electrons to, the floating gate. Inter-poly tunneling can be conveniently used only to remove electrons from the floating gate. To add electrons to the floating gate would require another poly layer below the floating gate, and at a high negative voltage with respect to it. There is therefore an urgent need for a low-power, controllable mechanism by which electrons can be injected onto the floating gate without paying the high cost of a high voltage of the opposite sign of that required for electron removal.

One way to inject charge in a controllable way over many orders of magnitude in rate is to use a split-gate structure such as that described in U.S. Pat. No. 4,622,656. The split-gate structure is formed in a two-gate-level process, such as a standard double-polysilicon gate process commonly available commercially.

This split-gate injection mechanism requires high voltage on the floating gate of the split gate structure. This requirement causes great problems in the circuit design of sensing circuits attached thereto. For that reason, it is desirable to use an injection scheme in which the floating gate can be used at a potential within the power supply rails, and the voltage required for injection be supplied by an electrode other than the floating gate.

There is an urgent need of an analog silicon device structure for performing the long-term learning function in a neural network. Preferably such a device structure would use a standard, widely available, highly developed silicon process. Such a learning structure should be compatible with standard silicon processing. It should have a writing rate which is a non-linear function of both input and output signals (Delta Rule) and which is accurately controllable to very small values. In addition, such a structure should operate using writing currents and voltages within operating limits of standard devices on the same chip.

BRIEF DESCRIPTION OF THE INVENTION

A first aspect of the present invention includes a p-type silicon substrate having first and second spaced apart n-type regions are formed therein. A polysilicon floating gate is separated from the surface of the silicon substrate by a layer of gate oxide. One edge of the polysilicon floating gate is aligned with the edge of the first n-type region such that the polysilicon floating gate does not lie appreciably over the n-type region. The second n-type region lies beyond the edge of the polysilicon floating gate. The first n-type region, the silicon substrate, and the second n-type region form the collector, base, and emitter, respectively, of a lateral bipolar transistor.

A second aspect of the present invention includes an n-type silicon substrate having a p-well region formed therein. An n-type region is formed within the well region. A polysilicon floating gate is separated from the surface of the silicon substrate by a gate oxide and is positioned above the well region. One edge of the polysilicon floating gate is aligned with the edge of the n-type region within the well region such that the polysilicon floating gate does not lie appreciably over the n-type region. The substrate, the well, and the n-type region, respectively, form the emitter, base, and collector of a bipolar transistor.

BRIEF DESCRIPTION OF THE DRAWINGS

FIG. 1a is a cross section of a prior art device.

FIG. 1b is a graph showing the relationship between electron energy and position in the structure of FIG. 1a.

DETAILED DESCRIPTION OF A PREFERRED EMBODIMENT

Prior Art

Figure 1:
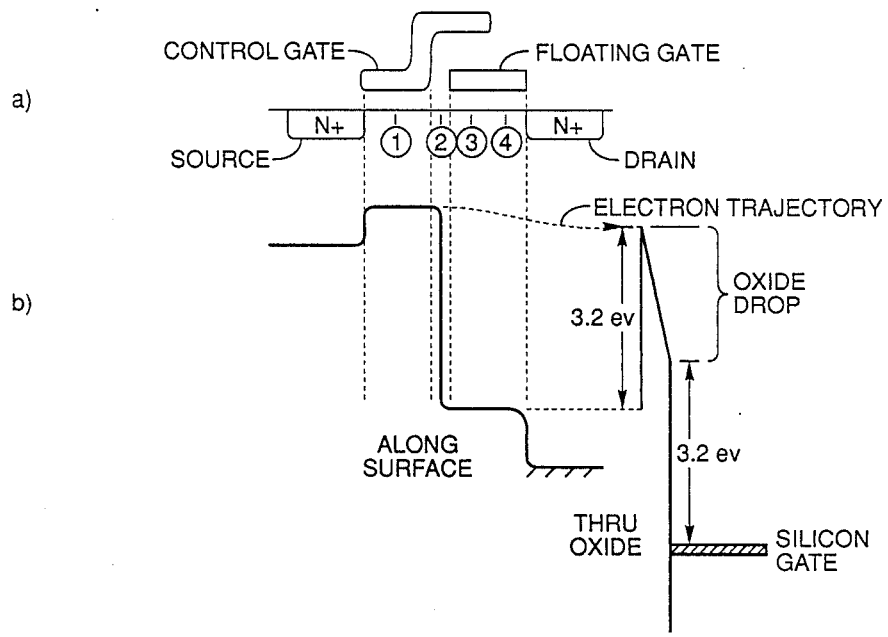

Referring first to FIG. 1a, a prior art split gate structure is shown. The prior art structure includes a p-type substrate having a n-type regions formed therein. A control gate formed from second level polysilicon forms a first section of the transistor. The floating gate formed from first level polysilicon forms a second section of the transistor. To write electrons onto the floating gate, the first section is operated in its sub-threshold region, and the floating gate is made very positive by an electrode capacitively coupled to it, preferably a layer of second level polysilicon overlying an area of the floating gate.

Figure 2:
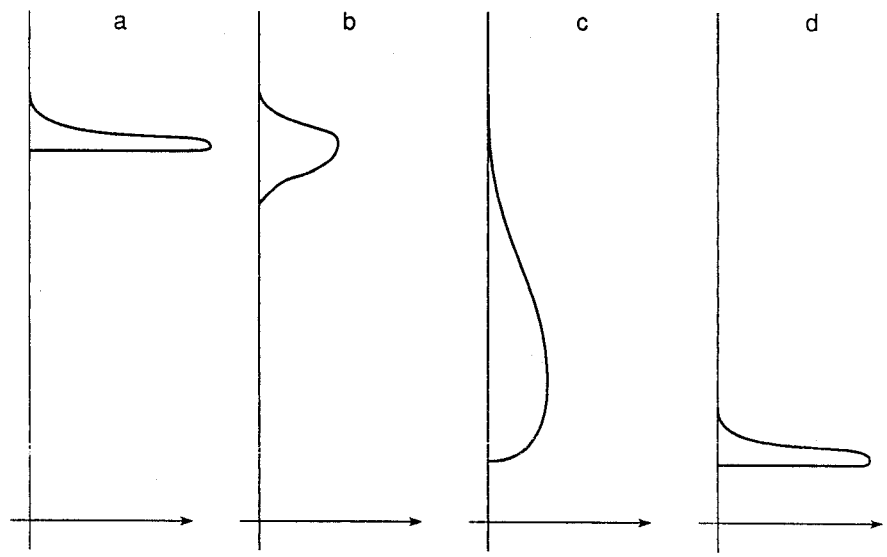
FIGS. 2a–d are graphs of energy distribution at four points along the channel of the device of FIG. 1.

The energy of the conduction band of the silicon substrate just at the oxide interface under these conditions is shown in FIG. 1b as a function of distance along the channel. Due to the small number of electrons in the channel in sub-threshold, the band edge stays above the source potential until it reaches the split between the two gate regions. The surface energy then drops abruptly in a very short distance to that set by the floating gate. There is thus created a very short region of very high electric field. Electrons flowing along the channel will be accelerated very rapidly when they reach this region, and some of them will have enough energy to surmount the energy barrier into the oxide separating the floating gate from the substrate, and will charge up the floating gate. Even if the electrons do not have enough energy to reach the oxide conduction band, they will have their tunneling probability enormously enhanced by virtue of their higher energy. The operation of the device can be better understood with reference to FIGS. 2 and 3. FIG. 2. shows the distribution of electron energies at three points along the channel, marked 1, 2, and 3, in FIG. 1b.

At point 1, the electrons are in the first section of the channel, and have a thermal distribution, with density decreasing by a factor of e every 25 mV (at room temperature). Just at the beginning of the gap between the gates at point 2, the electrons have been accelerated greatly, but have not yet travelled far enough to scatter very much, so their energy distribution will be peaked around the energy of the first part of the channel. It is this condition that allows charge injection through the top part of the barrier into the floating gate. After the electrons have travelled farther in the second part of the channel at point 3, their kinetic energy dissipates through interactions with the crystal lattice, and eventually they are in a thermal distribution at the energy of the conduction band in the second part of the channel.

Figure 3:
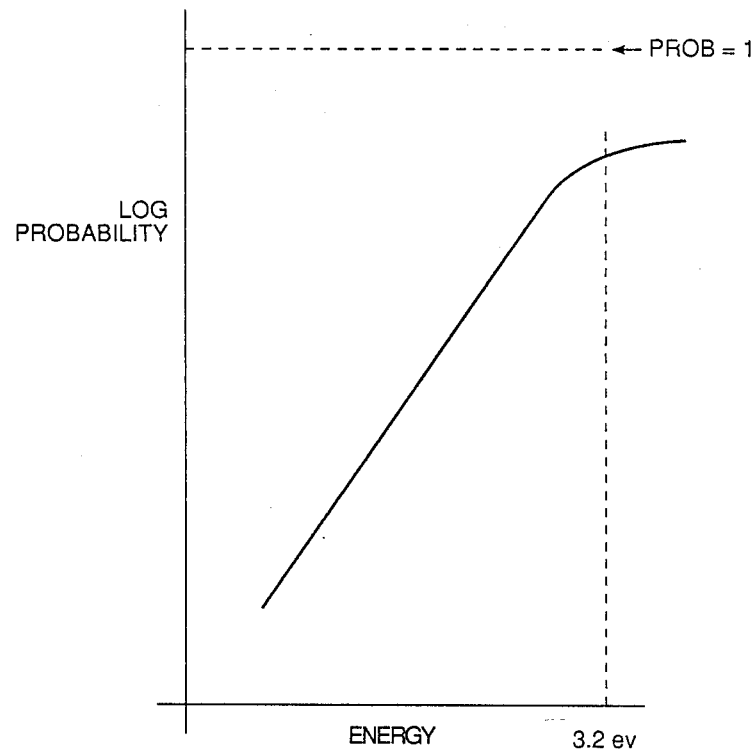
FIG. 3 is a graph of the tunnelling probability as a function of electron energy for the device of FIG. 1.

FIG. 3. shows the probability of tunneling of an electron through the oxide as a function of the electron's energy. It should be noted that the probability increases generally exponentially with increasing energy until the barrier height is reached, after which it approaches a nearly constant value close to one. Split-gate injection has limitations which render it undesirable for use in integrated long term learning applications. These limitations can be appreciated with reference to FIGS. 1a and 1b. Because the surface potential under the floating gate is determined by the potential on the floating gate, there must be a field in the gate oxide to bring the surface potential low enough to cause injection. This oxide field times the oxide thickness is the voltage drop across the gate oxide, labeled "oxide drop" in FIG. 1b. This oxide drop requires that the floating gate be, typically, two to three volts more positive than the surface potential. The requirement for high voltage on the floating gate causes great problems in the circuit design of sensing circuits attached thereto.

The Present Invention

The present invention uses a floating gate, and injects charge in a very controllable way over many orders of magnitude in rate. The charge-injection rate is a non-linear function of two variables: a voltage set by one signal, and a voltage controlled by another separate signal. Unlike the prior art devices, the present invention operates within the current and voltage limits of other devices on the same chip, and can thus be an integral part of a fully integrated technology. It therefore satisfies all of the requirements of a learning structure defined above.

Figure 4A:
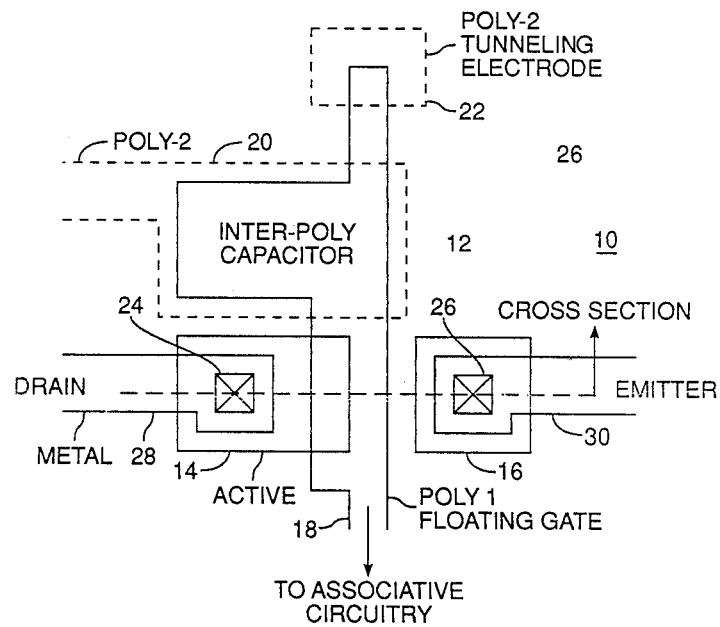
FIG. 4a is a top view of a long term learning device according to one presently preferred embodiment of the invention.

A top view of a first presently preferred embodiment of the present invention is illustrated in FIG. 4a. Learning device 10 is fabricated on p-type region 12, which may be either a p-type substrate in an n-well process or a p-well. Conventional, well-known CMOS processes may be used to fabricate the structures of the present invention. P-type region 12 may be a substrate used in a typical CMOS process and may be, for example, doped to a level of about $10^{16}/cm^3$. If p-type region 12 is a p-well, it may be a typical p-well in a conventional CMOS process and may be formed preferably by ion implantation and subsequent drive-in diffusion to a depth of 2–3 microns and a surface concentration of about $10^{16}$ atoms/$cm^3$.

A first active n-type region 14 is located within p-type region 12. A second active n-type region 16 is also formed within p-type region 12 and is spaced apart from n-type region 14. N-type regions 14 and 16 are formed in p-region 12 using standard source/drain implant steps common to conventional CMOS processes.

A gate oxide layer (shown in FIG. 4b) is formed on the surface of the substrate and may be preferably between about 100 to 400Å thick. The gate oxide layer may be formed using conventional semiconductor processing techniques.

Figure 4B:
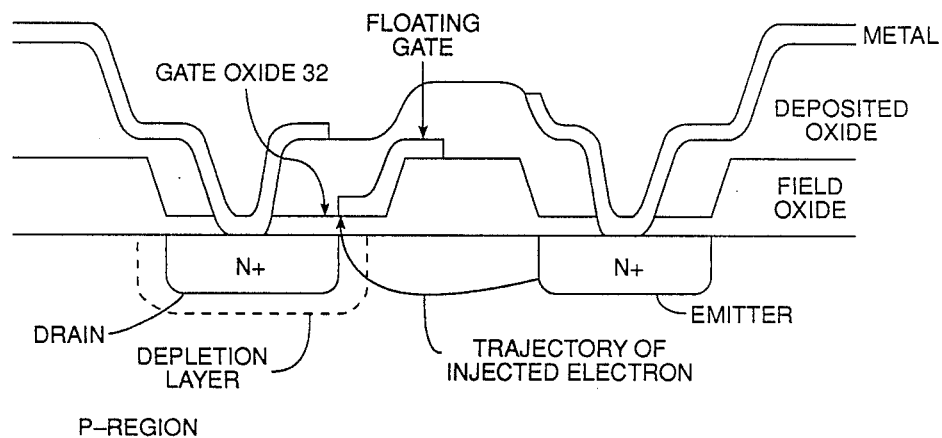
FIG. 4b is a cross sectional view of the device depicted in FIG. 4a, taken through the lines indicated.

A first level polysilicon floating gate 18, typically between about 0.5 to 1 micron thick is then formed over the gate oxide layer. Polysilicon floating gate 18 may be a standard first level polysilicon gate used in a conventional CMOS process. Floating gate 18 is shown in FIG. 4a partially overlapping first active n-type region 14. As will be appreciated by those of ordinary skill in the art, the border of n-type active region 18 defines the field oxide edge. Consequently, the portion of floating gate 18 lying over n-type active region 14 will be separated from the surface of the substrate by a layer of gate oxide, while the remainder of floating gate 18 will be separated from the surface of the substrate by a thicker layer of field oxide as indicated in FIG. 4b.

Because a conventional CMOS process may be used to fabricate the present invention, the source/drain implant step will be performed after the definition of the floating gate (i.e., self-aligned gate process) and the portion of n-type active region 14 lying under floating gate 18 will be doped only to the extent of lateral diffusion. After formation and patterning of the first level polysilicon region, an interpoly oxide layer is grown thereon, preferably by the same steps used to grow the gate oxide.

A first region 20 of second layer polysilicon overlies a large portion of floating gate 18, is separated therefrom by a layer of interpoly oxide as is well-known in the art, and is thus capacitively coupled thereto. The second polysilicon layer may be formed as a standard second electrode from second level polysilicon using conventional CMOS processing techniques. The first region 20 of second layer polysilicon is used to hold polysilicon floating gate 18 at the desired potential through capacitive coupling.

A second region of second layer polysilicon 22 overlies a smaller portion of floating gate 18 than does first region of second layer polysilicon 20, as shown in FIG. 4a, and is also separated from floating gate 18 by a layer of interpoly oxide. This second region of second layer polysilicon may, when biased to a high positive voltage (typically 10v positive with respect to floating gate 18 for a 400Å inter-poly oxide thickness) elicit electron tunneling from the floating gate, thereby charging it to a more positive potential. Contacts 24 and 26 connect n-type regions 14 and 16 to metal lines 28 and 30 respectively. Contacts 24 and 26 and metal lines 28 and 30 are formed using conventional semiconductor processing techniques.

FIG. 4b is a cross section of the structure of FIG. 4a, taken along the line 4b—4b. FIG. 4b shows the physical relationships between first n-type (drain) region 14, second n-type region (emitter) 16, and floating gate 18. In addition, FIG. 4b shows the gate oxide layer 32.

In the embodiment of FIGS. 4a and 4b, the N-type drain region 14 is biased to more than 3.2 volts positive with respect to the p-type region but well below the voltage required for avalanche breakdown. The separate n-type emitter region 16 is forward biased with respect to the p-type region, thereby acting as a source of minority carriers in the p-type region. These minority electrons are accelerated by the high electric field in the depletion layer near the drain, thereby gaining enough energy to surmount the oxide barrier and thus be injected onto the floating gate.

Figure 4C:
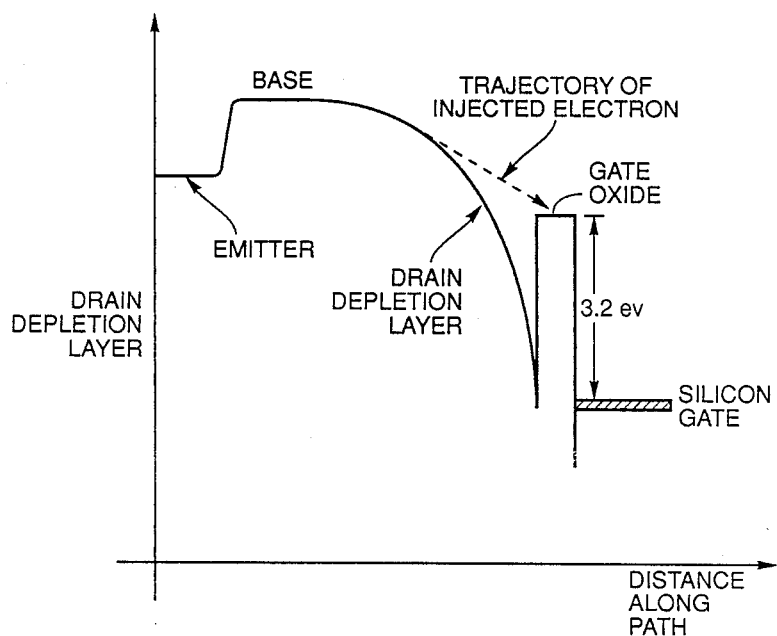
FIG. 4c is an energy band diagram showing the energy of the conduction band of the structure of FIGS. 4a and 4b along the trajectory of an injected electron.

An energy-band diagram showing the energy of the conduction band along the trajectory of an injected electron from the emitter through the base region and thence through the oxide interface under the conditions used for injection is shown in FIG. 4c. Also shown superimposed on the figure is the energy profile of an electron whose trajectory is shown in FIG. 4b. The depletion layer formed by the positive drain sets up an electric field perpendicular to the surface. This field is in exactly the direction to accelerate electrons toward the surface. Minority electrons flowing in the base toward the surface will be accelerated very rapidly when they reach this region, and some of them will have enough energy to surmount the energy barrier into the oxide separating the floating gate from the substrate, and will charge up the floating gate. Even if the electrons do not have enough energy to reach the oxide conduction band, they will have their tunneling probability enormously enhanced by virtue of their higher energy.

A key feature of the present invention is that, for a trajectory that enters the drain depletion layer immediately adjacent to the drain, the surface potential is set by the drain field, and not by the surface potential under the floating gate. The floating gate potential thus need be approximately two volts less positive than required by the split gate mechanism because the oxide voltage drop is eliminated. Great flexibility in circuit design is thus achieved.

Figure 5:
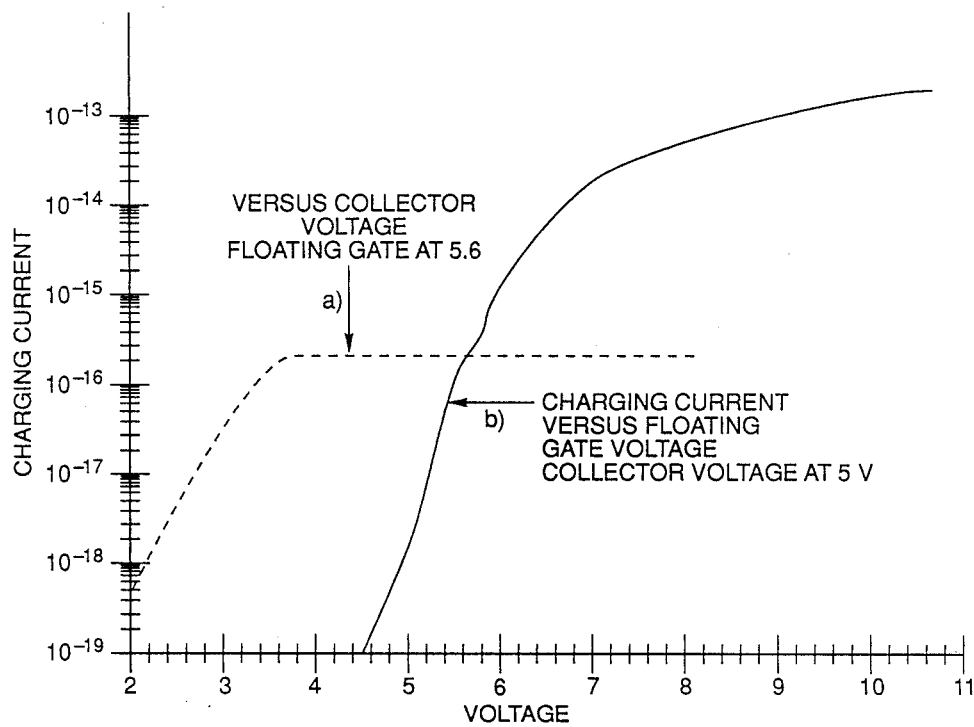
FIG. 5 is a graph showing the measured dependence of the charging current on both drain voltage and floating gate voltage of the device of FIGS. 4a and 4b.

The measured charging current of electrons flowing through the oxide onto the floating gate of the structure of FIGS. 4a and 4b is shown in FIG. 5. Curve a of FIG. 5 shows the dependence of the log of the charging current on drain voltage, and curve b of FIG. 5 shows the dependence of charging current on floating gate voltage. Both dependencies are exponential up to a certain voltage. The charging current saturates abruptly for drain voltages above the 3.2v barrier energy. The charging current continues to increase as the floating gate voltage is increased above the barrier energy. This structure thus fulfills the requirement that the charging rate be a non-linear function of two signals. The charging current is an approximately linear function of the emitter current. Injection of electrons on to the floating gate may be inhibited either by lowering the reverse bias on the drain region 14, or by reducing the forward bias on the emitter 16, or both.

Figure 6:
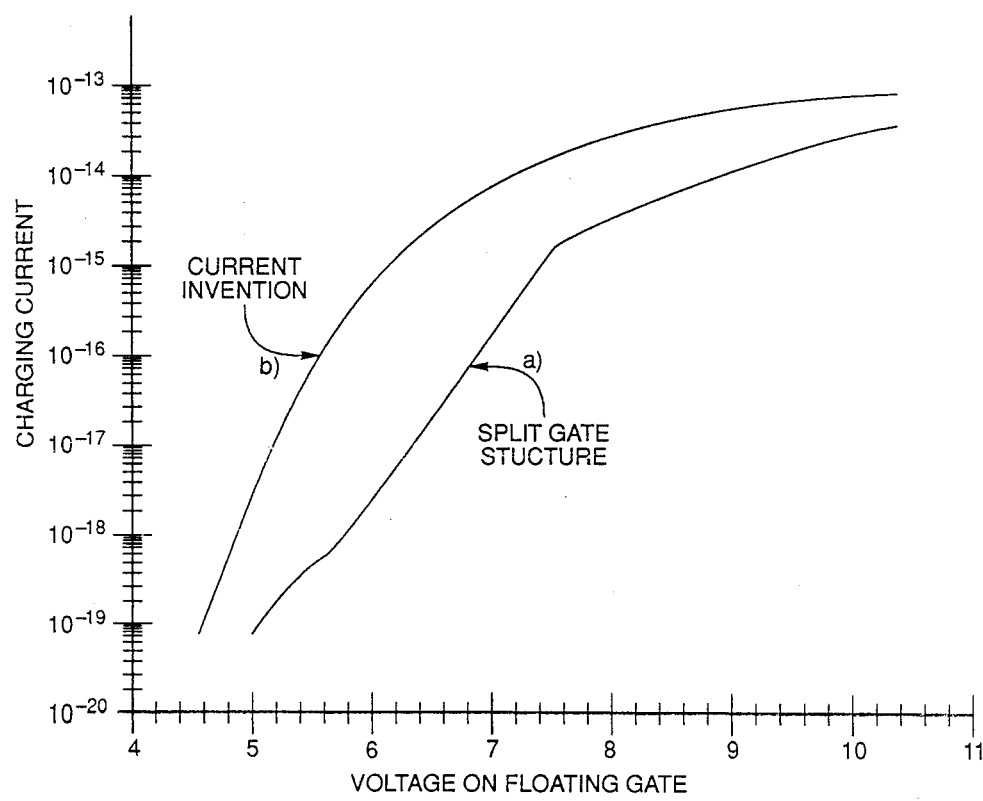
FIG. 6 is a graph wherein two curves show the comparative performance of the prior art split gate structure and the structure of the embodiments of FIGS. 4a and 4b of the present invention.

FIG. 6 is a graph showing a plot of the measured charging current as a function of the floating gate voltage for both the prior art split gate device and the structure of the present invention. Curve a of FIG. 6 is a graph showing a plot of the charging current as a function of the floating gate voltage for the prior art split gate device and curve b of FIG. 6 shows a plot of the charging current as a function of the floating gate voltage for the structure of the present invention. Both devices used to obtain the data in FIG. 6 were fabricated on the same wafer using identical silicon processing. A comparison of the two curves demonstrates the improved results obtained by the structure of the present invention.

An alternate preferred embodiment of the invention is a vertical structure which also uses the drain of an MOS transistor as the collector of an NPN bipolar transistor. This embodiment will be disclosed with reference to FIGS. 7a and 7b.

Figure 7A:
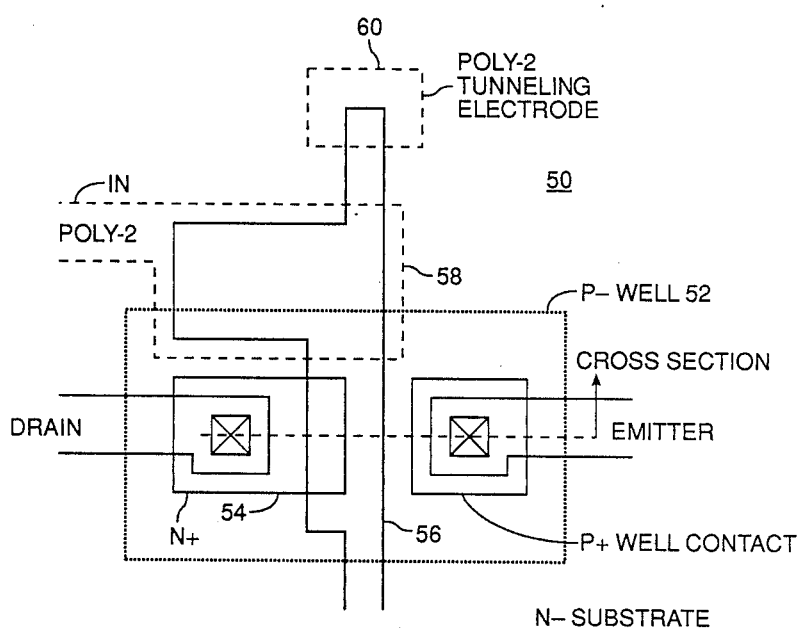
FIG. 7a is a top view of an alternate embodiment of a long term learning device according to the present invention.
Figure 7B:
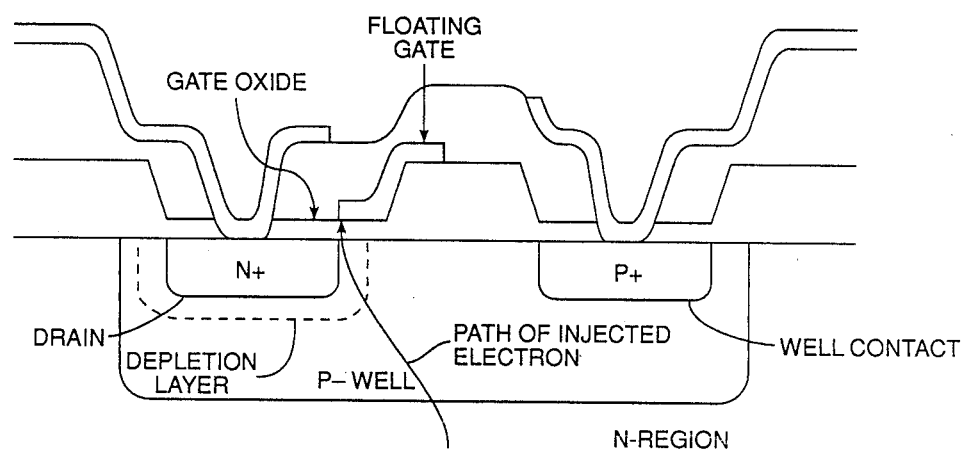
FIG. 7b is a cross sectional view of the device depicted in FIG. 6a, taken along the lines indicated.

FIG. 7a is a top view of the structure, and FIG. 7b is a cross sectional view of the structure of FIG. 7a, taken along the lines indicated.

Referring first to FIG. 7a, the learning device 50 is fabricated in a p-region 52 which forms the base of a vertical bipolar transistor. P-type region 52 is formed in an n-type semiconductor substrate 54 which serves as the emitter of the NPN bipolar transistor. Substrate 54 may be a substrate used in a typical CMOS process and may be, for example, doped to a level of about $10^{16}/cm^3$. The P-type region 52 in which the invention is formed may be a p-well formed in a standard CMOS process.

A smaller n-type drain region 54 is formed within the p-type region 52 and serves as the collector of the bipolar transistor. Drain region 54 may be ion implanted to the level of a standard source/drain diffusion in a conventional CMOS process and is typically 0.3 microns in depth.

A gate oxide layer (shown in FIG. 7b) is formed on the surface of the substrate and may be preferably between about 100 to 400Å. The gate oxide layer may be formed using conventional semiconductor processing techniques.

A polysilicon floating gate 56, typically between about 0.5 to 1 micron thick is then formed over the gate oxide layer. Polysilicon floating gate 56 may be a standard first level polysilicon gate used in a conventional CMOS process. Floating gate 56 is located such that one of its ends forms the self-aligned edge of the n-type region 54 as shown in FIG. 7a.

An inter-poly oxide layer is then formed by oxidation of the first polysilicon layer, as is well known in the art.

First electrode 58 is next formed over polysilicon floating gate 56 over the interpoly oxide layer as is well known in the art. Electrode 58 may be formed as a standard second electrode from second level polysilicon using conventional CMOS processing techniques and is used to hold polysilicon floating gate 56 at the desired potential through capacitive coupling.

A second electrode 60 may be formed from a region of second layer polysilicon as shown in FIG. 7a. Second electrode 60 is capacitively coupled to floating gate 56 to a lesser extent than is first electrode 58 as is shown in FIG. 7a. This second electrode 60 region of second layer polysilicon may, when biased to a high positive voltage (typically 10v positive with respect to floating gate 56 for a 400Å inter-poly oxide thickness) elicit electron tunneling from the floating gate, thereby charging it to a more positive potential.

FIG. 7b shows a cross-section of the structure of FIG. 7a taken through the line indicated. FIG. 7b shows the physical relationships between n-type (drain) region 54, floating gate 56 and the well region 52. In addition, FIG. 7b shows the gate oxide layer.

In the embodiment of FIGS. 7a and 7b, the N-type drain region 54 is biased to more than 3.2 volts positive with respect to the p-well 52 but well below the voltage required for avalanche breakdown. The p-well 52 is forward biased with respect to the n-type substrate 54, thereby acting as a source of minority carriers in the well.

The floating gate 56, formed from first-gate level polysilicon, forms the gate of an MOS capacitor. To write electrons onto the floating gate 56, the drain 54 of the MOS transistor is taken to a positive voltage greater than 3.2 volts, and minority carriers are injected into the base of the bipolar transistor (the p-well 52) by forward biasing its emitter-base junction (the well-to substrate junction). The floating gate 56 is held at a positive voltage greater than 3.2 volts relative to the conduction band in the p-type base region (the p-well 52) by electrode 58 capacitively coupled to the floating gate 56.

In co-pending application serial No. 322,490, filed Mar. 10, 1989, there is described an associative synapse in which the desired signal level is stored as a charge on a floating gate. The desired charge was achieved using ultraviolet light to either remove electrons from, or add electrons to all floating gates simultaneously. Using the present invention, the same synaptic structure can be used to associate an input signal vector with a stored vector, but the stored charge can be selectively modified on a neuron-by-neuron basis. In such a structure, electrons can be selectively removed from the floating gate using inter-poly tunneling, and can be selectively added to the floating gate using the present invention.

In a third embodiment of the present invention, the minority carriers required for injection are generated by visible or infra-red light falling on the structure, rather than by a forward biased junction. The structure of this embodiment can be the same as that shown in FIGS. 4a and 4b, except that the emitter and its associated contact are not required. An array of such structures can be programmed by biasing them appropriately and focussing a visible light image on the array.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. A semiconductor structure for long term learning including:

a p-type region in a semiconductor substrate, a first n-type region disposed in said p-type region, a floating gate disposed above said p-type region, said floating gate at least partially overlapping one edge of said first n-type region and separated from the surface of said substrate by a gate oxide under a portion of said floating gate including at least where it partially overlaps the edge of said first n-type region, means for applying a first positive potential to said first n-type region with respect to said p-type region to reverse bias said first n-type region, said first positive potential having a magnitude of greater than about 3.2 volts relative to said p-type region, but less than the voltage required to induce avalanche breakdown in the junction between said first n-type region and said p-type region, means for capacitively coupling a second positive potential to said floating gate, said second positive potential having a magnitude of greater than about 3.2 volts relative to said p-type region, a second n-type region in contact with said p-type region, means for applying a negative potential to said second n-type region with respect to said p-type region to forward bias said second n-type region, and to thereby inject minority electrons into said p-type region, an insulating layer over said floating gate, a conductive region disposed over said insulating layer and capacitively coupled to said floating gate, means for selectively applying a third positive potential to said conductive region with respect to said floating gate, whereby said first and second positive potentials act to accelerate said minority electrons to an energy sufficient to surmount the barrier energy of said gate oxide and thereby inject said minority electrons onto said floating gate and whereby said third positive potential causes electrons to tunnel from said floating gate to said conductive region.

2. A semiconductor structure for long term learning including:
   a p-type region in a semiconductor substrate,
   an n-type region disposed in said p-type region,
   a floating gate disposed above said p-type region, said floating gate at least partially overlapping one edge of said n-type region and separated from the surface of said substrate by a gate oxide under a portion of said floating gate including at least where it partially overlaps the edge of said n-type region,
   means for applying a first positive potential to said n-type region with respect to said p-type region to reverse bias said n-type region, said positive potential having a magnitude of greater than about 3.2 volts relative to said p-type region, but less than the voltage required to induce avalanche breakdown in the junction between said n-type region and said p-type region,
   means for capacitively coupling a second positive potential to said floating gate, said second positive potential having a magnitude of greater than about 3.2 volts relative to said p-type region,
   means for injecting minority electrons into said p-type region,
   an insulating layer over said floating gate,
   a conductive region disposed over said insulating layer and capacitively coupled to said floating gate,
   means for selectively applying a third positive potential to said conductive region with respect to said floating gate,
   whereby said first and second positive potentials act to accelerate said minority electrons to an energy sufficient to surmount the barrier energy of said gate oxide and thereby inject said minority electrons onto said floating gate and whereby said third positive potential causes electrons to tunnel from said floating gate to said conductive region.

3. A semiconductor structure for long term learning including:
   an n-type semiconductor substrate,
   a p-type well region in said semiconductor substrate,
   an n-type region disposed in said p-type well region,
   a floating gate disposed above said p-type region, said floating gate at least partially overlapping one edge of said n-type region and separated from the surface of said substrate by a gate oxide under a portion of said floating gate including at least where it partially overlaps the edge of said n-type region,
   means for capacitively coupling a first positive potential to said floating gate, said first positive potential having a magnitude of greater than about 3.2 volts relative to said p-well,
   means for applying a second positive potential to said n-type region with respect to said p-type region to reverse bias said n-type region, said second positive potential having a magnitude of greater than about 3.2 volts relative to said p-type region, but less than the voltage required to induce avalanche breakdown in the junction between said n-type region and said p-type region,
   means for applying a third positive potential to said p-type well region with respect to said semiconductor substrate to forward bias said p-type well region, and to thereby inject minority electrons into said p-type region,
   an insulating layer over said floating gate,
   a conductive region disposed over said insulating layer and capacitively coupled to said floating gate,
   means for selectively applying a third positive potential to said conductive region with respect to said floating gate,
   whereby said first and second positive potentials act to accelerate said minority electrons to an energy sufficient to surmount the barrier energy of said gate oxide and thereby inject said minority electrons onto said floating gate and whereby said third positive potential causes electrons to tunnel from said floating gate to said conductive region.

4. A semiconductor structure for long term learning including:
   an p-type region in a semiconductor substrate,
   a first n-type region disposed in said p-type region, said floating gate at least partially overlapping one edge of said first n-type region and separated from the surface of said substrate by a gate oxide under a portion of said floating gate including at least where it partially overlaps the edge of said fist n-type region,
   means for applying a first positive potential to said first n-type region with respect to said p-type region to reverse bias said first n-type region, said first positive potential having a magnitude of greater than about 3.2 volts relative to said p-type region, but less than the voltage required to induce avalanche breakdown in the junction between said first n-type region and said p-type region,
   means for capacitively coupling a second positive potential to said floating gate, said second positive potential having a magnitude of greater than about 3.2 volts relative to said p-type region,
   a second n-type region disposed in said p-type region, laterally spaced from said first n-type region,
   means for applying a negative potential to said second n-type region with respect to said p-type region to forward bias said second n-type region, and to thereby inject minority electrons into said p-type region,
   an insulating layer over said floating gate,
   a conductive region disposed over said insulating layer and capacitively coupled to said floating gate,
   means for selectively applying a third positive potential to said conductive region with respect to said floating gate,
   whereby said first and second positive potentials act to accelerate said minority electrons to an energy sufficient to surmount the barrier energy of said gate oxide and thereby inject said minority electrons onto said floating gate and whereby said third positive potential causes electrons to tunnel from said floating gate to said conductive region.

5. The semiconductor structure of claim 1 wherein said means for capacitively coupling a second positive potential to said floating gate comprises a conductor coupled to said floating gate by a first capacitance.

6. The semiconductor structure of claim 5 wherein said conductive region is capacitively coupled to said floating gate by a second capacitance having a magnitude less than the magnitude of said first capacitance.

7. The semiconductor structure of claim 2 wherein said means for capacitively coupling a second positive potential to said floating gate comprises a conductor coupled to said floating gate by a first capacitance.

8. The semiconductor structure of claim 7 wherein said conductive region is capacitively coupled to said floating gate by a second capacitance having a magnitude less than the magnitude of said first capacitance.

9. The semiconductor structure of claim 3 wherein said means for capacitively coupling a second positive potential to said floating gate comprises a conductor coupled to said floating gate by a first capacitance.

10. The semiconductor structure of claim 9 wherein said conductive region is capacitively coupled to said floating gate by a second capacitance having a magnitude less than the magnitude of said first capacitance.

11. The semiconductor structure of claim 4 wherein said means for capacitively coupling a second positive potential to said floating gate comprises a conductor coupled to said floating gate by a first capacitance.

12. The semiconductor structure of claim 11 wherein said conductive region is capacitively coupled to said floating gate by a second capacitance having a magnitude less than the magnitude of said first capacitance.

* * * * *